(12) United States Patent
Keene

(10) Patent No.: US 7,113,092 B2
(45) Date of Patent: Sep. 26, 2006

(54) FERROMAGNETIC OBJECT DETECTOR

(75) Inventor: Mark Nicholas Keene, Malvern (GB)

(73) Assignee: QinetiQ Limited (GB)

( * ) Notice: Subject to any disclaimer, the term of this patent is extended or adjusted under 35 U.S.C. 154(b) by 38 days.

(21) Appl. No.: 10/706,593

(22) Filed: Nov. 12, 2003

(65) Prior Publication Data

US 2004/0135687 A1 Jul. 15, 2004

(30) Foreign Application Priority Data

Nov. 12, 2002 (GB) ............................................. 0226334

(51) Int. Cl.
*G08B 13/24* (2006.01)

(52) U.S. Cl. ................. 340/551; 340/686.1; 340/686.6; 324/207.26

(58) Field of Classification Search ................. 340/551, 340/552, 572, 686.1, 686.6; 324/326, 323, 324/200, 207.26
See application file for complete search history.

(56) References Cited

U.S. PATENT DOCUMENTS

| | | | |
|---|---|---|---|
| 3,573,817 A | | 4/1971 | Akers |
| 3,665,449 A | * | 5/1972 | Elder et al. ............... 340/572.1 |
| 3,725,888 A | | 4/1973 | Solomon |
| 3,971,983 A | | 7/1976 | Jaquet |
| 4,326,198 A | | 4/1982 | Novikoff |
| 4,413,254 A | | 11/1983 | Pinneo et al. |
| 4,595,915 A | * | 6/1986 | Close ....................... 340/572.2 |
| 4,888,579 A | * | 12/1989 | ReMine et al. .......... 340/572.4 |
| 5,726,628 A | * | 3/1998 | Yoo ............................ 340/551 |
| 5,790,685 A | | 8/1998 | Sallee |
| 6,133,829 A | * | 10/2000 | Johnstone et al. .......... 340/551 |
| 6,307,473 B1 | * | 10/2001 | Zampini et al. ......... 340/572.1 |
| 6,308,644 B1 | * | 10/2001 | Diaz ............................. 109/6 |
| 6,819,241 B1 | * | 11/2004 | Turner et al. ............... 340/551 |
| 2003/0171609 A1 | | 9/2003 | Kopp |
| 2004/0147833 A1 | | 7/2004 | Czipott et al. |
| 2004/0147834 A1 | | 7/2004 | Czipott et al. |
| 2004/0169509 A1 | | 8/2004 | Czipott et al. |
| 2004/0189293 A1 | | 9/2004 | Czipott et al. |

FOREIGN PATENT DOCUMENTS

| | | |
|---|---|---|
| EP | 0 353 035 | 1/1990 |
| EP | 0 831 339 | 3/1998 |
| WO | WO 96/36873 | 11/1996 |
| WO | WO 03/077725 | 9/2003 |

* cited by examiner

Primary Examiner—Thomas J. Mullen, Jr.
Assistant Examiner—Travis Hunnings
(74) Attorney, Agent, or Firm—McDonnell Boehnen Hulbert & Berghoff LLP

(57) ABSTRACT

An apparatus for detecting ferromagnetic objects in the vicinity of a magnetic resonance imaging scanner. The apparatus comprises primary sensor means adapted to measure a magnetic field, arranged in communication with signal processing means configured to identify temporal variations in the measured magnetic field due to the movement of a ferromagnetic object within an ambient magnetic field and to provide an output indicative of the presence of a ferromagnetic object in the vicinity of the primary sensor means. The apparatus further comprises secondary, non-magnetic, sensor means adapted to detect the movement of objects in the vicinity of the primary sensor means in order to reduce false alarms. The output from the signal processing means may be used to operate an audible alarm, a visual alarm, an automatic door lock or a physical barrier.

20 Claims, 5 Drawing Sheets

FERROMAGNETIC OBJECT DETECTOR

BACKGROUND OF THE INVENTION

1. Field of the Invention

The present invention relates to an apparatus for detecting ferromagnetic objects and in particular to a device for detecting the presence of ferromagnetic objects in the vicinity of magnetic resonance imaging (MRI) scanners.

2. Discussion of Prior Art

Most major hospitals have rooms for Magnetic Resonance Imaging (MRI) scanners. These scanners have a large magnet that is usually superconducting and produces a very high magnetic field up to several Tesla within the bore of the MRI scanner. The magnetic field strength outside of the magnet falls rapidly with distance creating very large magnetic field gradients in the surrounding room. Any ferromagnetic metal object in the vicinity of the magnet will experience a force attracting it towards the magnet. The force exerted by the magnet may be sufficiently strong to accelerate an unrestrained ferromagnetic object towards the MRI scanner, where it will come to rest in or near to the bore of the MRI scanner. This is called the projectile effect or missile effect and it can be very dangerous and damaging.

Large ferromagnetic metal objects undergoing the projectile effect can enter the bore of the MRI scanner with sufficient kinetic energy to injure a patient or damage the MRI machine extensively. Furthermore, such objects may be impossible to remove from the bore without switching the magnetic field off. It can take over a week to restore the field and the down-time can be expensive for the hospital.

Examples of problem ferromagnetic objects that cause projectile effect accidents include gas bottles (small and large), wheelchairs, tool boxes, mop buckets, vacuum cleaners, pens, scissors and various medical devices, for example defibrillators and respirators.

Because of these dangers a strict screening procedure is enforced that is usually adequate in ensuring that staff and patients are free of ferromagnetic metal objects before entering the room in which the MRI scanner is located. However, there are a few major instances of projectile effects in the world every year and many minor incidents. Each major incident is usually very costly to the hospital or their insurers.

Metals that are non-ferrous do not present this danger and are used routinely in MRI rooms. Metal items for use in MRI rooms are usually pre-approved. However, it is often difficult for people to know if a metal is ferrous or non-ferrous and it is not always convenient to check for approved items. Accordingly, there is always a danger of the projectile effect due to oversights and mistakes on part of staff and patients, and general human error.

Installing metal detectors at the entrance to hospital rooms in which MRI scanners are located might help reduce the incidence of MRI related accidents (The New England Journal of Medicine 2001; 345; pp 1000–1001). For example, it has been suggested that an archway metal detector, similar to those employed at airports, could be placed at the entrance to an MRI room to detect metal objects which might pose a danger.

However, there are several difficulties with the above suggestion which have hitherto precluded the use of conventional metal detectors for screening persons in the vicinity of an MRI scanner.

Firstly, the metal detector would have to reliably discriminate between ferromagnetic and non-ferromagnetic metals otherwise it would alarm on approved metal objects. Not all conventional archway metal detectors are capable of such discrimination.

Discriminating metal detectors are available, however such devices tend to transmit relatively large amounts of electromagnetic energy. This is not desirable in a clinical environment where sensitive equipment abounds.

Moreover, conventional archway metal detectors are primarily aimed at security applications rather than safety applications and typically exhibit a high degree of sophistication (see for example U.S. Pat. No. 3,971,983). Consequently, sophisticated archway metal detectors are prohibitively expensive for use in MRI screening applications.

Furthermore, conventional archway metal detectors are physically incompatible with the beds, trolleys and wheelchairs used in a hospital environment (see for example U.S. Pat. No. 6,133,829).

Finally, conventional metal detection systems aimed at security applications are almost exclusively attended by an operator who will take appropriate action in response to a visual or audible signal from the metal detection system. In contrast, a screening device for an MRI scanner must operate automatically to provide an audible/visual warning of a potential danger, and even prohibit access to the MRI scanner if appropriate.

It is an object of the present invention to mitigate at least some of the disadvantages of the foregoing metal detection systems. It is a further object of the present invention to provide an alternative device for detecting ferromagnetic objects in the vicinity of an MRI scanner.

SUMMARY OF THE INVENTION

According to a first aspect of the present invention, there is now proposed an apparatus for detecting a ferromagnetic object comprising primary sensor means adapted to measure a magnetic field and to produce a corresponding measurement signal, secondary, non-magnetic, sensor means adapted to detect the movement of objects in the vicinity of the primary sensor means, and signal processing means arranged in communication with the primary and secondary sensor means, wherein the signal processing means is configured to identify temporal variations in the measurement signal due to the movement of a ferromagnetic object within an ambient magnetic field and to correlate the identified temporal variations in the measurement signal with movement of objects detected by the secondary, non-magnetic sensor means, and to provide an output indicative of the presence of a ferromagnetic object in the vicinity of the primary sensor means only in the presence of a correlation therebetween.

The above mentioned apparatus is advantageous in that ferromagnetic objects can be reliably detected using a combination of the primary and secondary sensor means. False alarms due to interference from non-hazardous ferromagnetic objects moving within the extended zone of sensitivity of the apparatus are reduced by the combination of the primary and secondary sensor means.

The apparatus is optimised to merely detect the presence of a ferromagnetic object in the vicinity of the primary sensor means rather than to indicate the exact location of a ferromagnetic object. The capability to merely detect the presence of a ferromagnetic object is sufficient since the apparatus is primarily intended to detect ferromagnetic objects inadvertently brought into the vicinity of the primary sensor means rather than deliberately concealed therefrom.

In the interest of clarity, it should be noted that the ambient magnetic field referred to above may comprise several components, for example arising from the earth's magnetic field, any localised magnetic fields generated by magnetic or electromagnetic equipment, and local perturbations in the above magnetic field(s) due to static ferromagnetic objects located therein. In the absence of extraneous interference (caused, for example, by the movement of ferromagnetic objects), it is assumed that the ambient magnetic field is substantially static and has substantially constant field strength.

Preferably, the secondary, non-magnetic sensor means comprises at least one of a photo-electric sensor, a fibre-optic sensor, a passive infrared sensor, a camera, a thermal imager, an ultrasonic sensor, a radar sensor, an electrostatic sensor, a millimeter wave sensor and a pressure sensitive mat.

In a preferred embodiment the apparatus further comprises at least one of an audible warning device, a visual warning device and means for preventing access to a prohibited area, operable by the output from the signal processing means.

The audible and visual warning devices provide the advantage that an immediate and direct warning is provided of the presence of a ferromagnetic object. The output from the apparatus does not require analysis by a skilled operator as would be the case for a conventional security ferrous metal detector.

The means for preventing access provides an additional benefit should the audible and visual warning devices be ignored.

Advantageously, the means for preventing access comprises at least one of a locking device and a barrier device.

In a further preferred embodiment, the signal processing means comprises filter means arranged to substantially reject spurious variations in the measured magnetic field.

Conveniently, the filter means comprises a high-pass filter.

Advantageously, the high-pass filter is responsive to the measurement signal produced by the primary sensor means to attenuate variations therein having a frequency of less than 0.3 Hz.

Preferably, the filter means comprises a low-pass filter.

Advantageously, the low-pass filter is responsive to the measurement signal produced by the primary sensor means to attenuate variations therein having a frequency of greater than 3 Hz.

Preferably, the signal processing means comprises means for comparing the amplitude of the output from the filter means with an adjustable threshold level so as to indicate temporal variations in the measurement signal due to the movement of a ferromagnetic object within an ambient magnetic field.

The means for comparing the amplitude of the output from the filter means with an adjustable threshold level is advantageous in that the sensitivity of the apparatus may be adjusted depending on the size and magnetic signature of the ferromagnetic object to be detected and the level of background interference.

In a preferred embodiment, the primary sensor means has a first magnetic sensor comprising one of a fluxgate sensor, a magneto-resistive sensor, a magneto-impedance sensor, a hall-effect sensor, and a galvanic coil sensor. Additionally, the primary sensor means may have a second magnetic sensor comprising one of a fluxgate sensor, a magneto-resistive sensor, a magneto-impedance sensor, a hall-effect sensor, and a galvanic coil sensor.

The apparatus is optimised to detect a ferromagnetic object using a localised primary sensor means. It is assumed that a ferromagnetic object to be detected will pass through a given volume of space. Accordingly, the zone of sensitivity of the primary sensor means and the positioning of the primary sensor means in use, are optimised to detect ferromagnetic objects within the above mentioned given volume of space.

For example, where the apparatus is used to detect ferromagnetic objects at the entrance to a magnetic resonance imaging scanner, it may be assumed that any ferromagnetic objects will be carried or transported at about waist height. The primary sensor means would therefore be located at approximately waist height and be arranged to detect ferromagnetic objects across the entire width of the entrance. In this example, the entrance to the scanner provides a physical restriction which ensures that anyone entering or leaving the MRI suite (the room in which the magnetic resonance imaging scanner is located) will pass through the zone of sensitivity of the primary sensor means. In this example, the apparatus is aimed primarily at a safety application, namely to detect ferromagnetic objects being inadvertently carried near the magnetic resonance imager, rather than to detect the deliberate concealment of a ferromagnetic object (security applications). Accordingly, an archway style ferrous metal detector, as used in security applications, is not required.

Conveniently, at least one of the first and second magnetic sensors is separable from the signal processing means such that, in use, the at least one separable sensor may be disposed remotely to the signal processing means.

In use, the primary sensor means may be arranged to detect ferromagnetic objects in the vicinity of a magnetic resonance imaging scanner.

According to a second aspect of the present invention, there is now proposed a magnetic resonance imaging scanner comprising an apparatus for detecting ferromagnetic objects according to the first aspect of the present invention.

According to a third aspect of the present invention, a method for detecting a ferromagnetic object comprises the steps of (i) measuring a magnetic field using primary sensor means and producing a corresponding measurement signal, (ii) detecting the movement of objects in the vicinity of the primary sensor means using secondary, non-magnetic, sensor means, (iii) identifying temporal variations in the measurement signal produced by the primary sensor means due to the movement of a ferromagnetic object within an ambient magnetic field, (iv) assessing said identified temporal variations in the measurement signal in conjunction with movement of objects detected by the secondary, non-magnetic sensor means to determine a correlation there-between, and (v) in the occurrence of a correlation, providing an indication of the presence of a ferromagnetic object.

The foregoing aspects of the present invention utilise secondary, non-magnetic, sensor means to detect the movement of objects in the vicinity of the primary sensor means. Alternatively, the secondary, non-magnetic, sensor means may be omitted from the apparatus, however susceptibility to false alarms may be increased.

Therefore, according to another aspect of the present invention, there is now proposed an apparatus for detecting a ferromagnetic object comprising primary sensor means adapted to measure a magnetic field and to produce a corresponding measurement signal, arranged in communication with signal processing means configured to identify temporal variations in the measurement signal due to the movement of a ferromagnetic object within an ambient magnetic field and to provide an output indicative of the presence of a ferromagnetic object in the vicinity of the primary sensor means.

BRIEF DESCRIPTION OF THE DRAWINGS

The invention will now be described, by example only, with reference to the accompanying drawings in which.

DETAILED DESCRIPTION OF THE PREFERRED EMBODIMENTS

Figure 1:
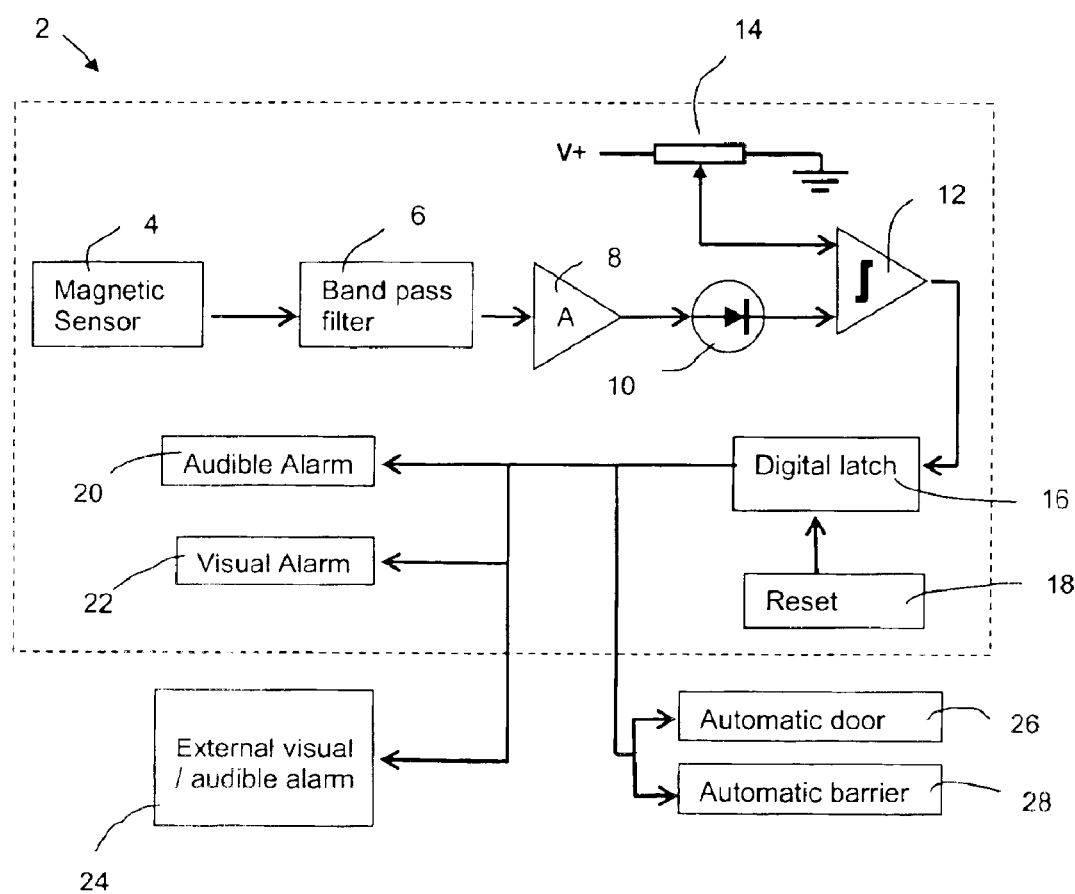
FIG. 1 shows a schematic representation of the ferromagnetic object detector according to the present invention.

Referring to FIG. 1, the ferromagnetic object detector (2) according to the present invention comprises a magnetic sensor (4), such as a fluxgate sensor, a magneto-resistive sensor, a magneto-impedance sensor, a hall-effect sensor, or a galvanic coil sensor, that outputs a signal that is a measurement of the magnetic field incident upon the sensor (4). Since the ferromagnetic object detector (2) will invariably be installed in a fixed position, for most of the time the sensor (4) will register a largely unchanging ambient magnetic field due to the earth. This constitutes a large offset on the output of the sensor. The signal due to the ambient field can be removed using a high pass filter. Furthermore, in a hospital environment, for example, there is a lot of ambient magnetic noise particularly at the power supply frequency and its harmonics. These frequencies are above those of interest so they may be removed with a low pass filter. The filters collectively constitute a band-pass filter (6) to perform these functions.

The time for a person to pass a location is typically within the range 0.3 to 3 seconds. The reciprocal of these times are the frequencies of interest, approximately 0.3 to 3 Hz. This is the passband of interest. Because the main D.C. field of the earth and the higher frequencies of the ambient magnetic noise are removed, the remaining signal is small and is amplified, by an amplifier (8), to a convenient level.

If a ferromagnetic object passes close to the sensor (4), the ambient magnetic field will be altered causing a change in the output of the sensor (4). That change will pass the filter (6) and be amplified by the amplifier (8). In order to trigger an alarm the signal size is compared to a pre-set threshold. Because the signal may be positive or negative, the threshold detector consists of a rectification stage (10) followed by a comparator (12) that has a circuit (14) to provide a threshold voltage. Alternatively, separate comparators are used for positive and negative signals with the outputs combined to give a single alarm signal instead of a rectifier (10) and a single comparator (12). The output of the comparator (12) may be arranged to have logic level 'zero' for the state where the signal does not exceed the threshold, and logic level 'one' for the state when the signal has exceeded the threshold.

It should be noted that the output of the comparator (12) will return to logic level 'zero' when the ferromagnetic object has passed the sensor and its signal has dropped below the threshold. In practice, the ALARMED state needs to be maintained until a reset signal is provided (for example by pressing a reset button). A digital latch (16) is used to maintain an ALARMED state after the ferromagnetic object has passed the magnetic sensor (4). The latch (16) consists of a simple reset-set flip-flop (RS flip-flop). Alternatively, other methods may be used to latch the output of the comparator (12). Once the reset button (18) is pressed the output of the latch (16) returns to the NOT ALARMED state.

The digital latch (16) is used to trigger one or more warning devices such as an audible alarm (20) and a visual alarm (22). Depending on the circumstances it may be appropriate to have one of these alarms. All of these functions may be constructed in a single unit to be mounted on a wall or on a stand that is fixed to the floor as appropriate. The unit incorporates outputs to activate external components, for example remote audible and visual alarm devices (24) that are mounted above the door to a MRI room so the person can see the visual alarm (24) directly in front of them although the sensor unit would be by their side.

In addition, connections are available for activating access control devices such as electronic door locks (26) or barriers (28), so physical prevention may be invoked.

In an alternative embodiment of the present invention, the magnetic sensor (4) is separate from the main (master) unit but connected to it by wires. In this embodiment of the present invention, the master unit is identical to that shown in FIG. 1, except in that the magnetic sensor (4) of FIG. 1 is removed and is mounted separately and connected to the master unit by a cable. This allows the main unit to be located in a convenient place; not necessarily adjacent to the thoroughfare before the room in which the MRI scanner is located.

For rooms where wide or double doors are used, the sensing range of this device may be insufficient to cover the whole area of the thoroughfare adequately. In this case a second sensor is required that is placed on the opposite side of the thoroughfare so each sensor needs to only cover half of the width of the thoroughfare.

Figure 2:
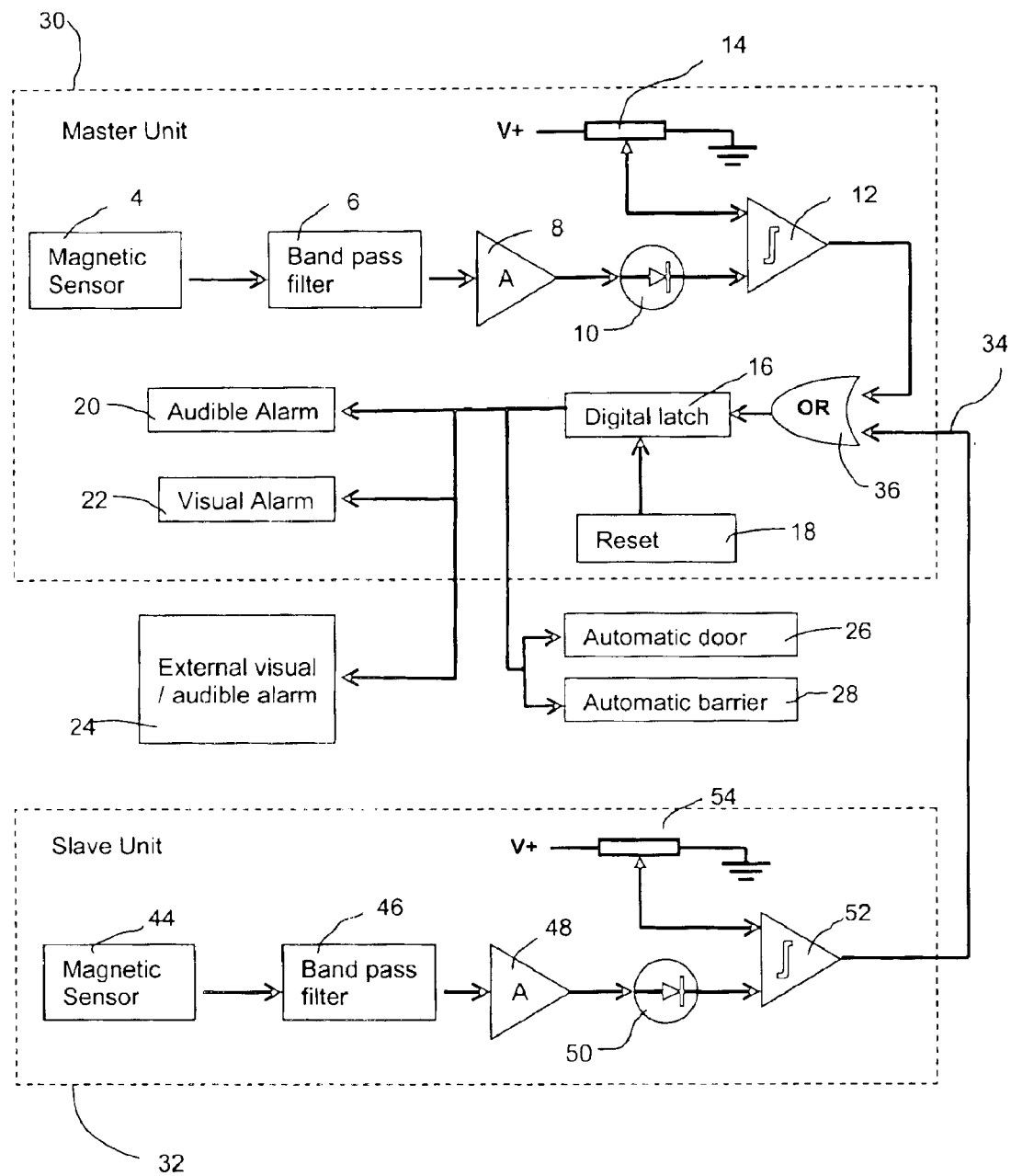
FIG. 2 illustrates an alternative embodiment of the present invention having a second magnetic sensor.

Referring to FIG. 2, one way of achieving the above is to use a master unit (30) and a slave unit (32) that are mounted respectively either side of the thoroughfare. The master unit (30) is identical to that of FIG. 1 with the exception of an additional input (34) and a digital OR gate (36). The slave unit (32) comprises a slave magnetic sensor (44) which outputs a signal that is a measurement of the magnetic field incident upon the sensor (44). The output from the slave magnetic sensor (44) is filtered by a band pass filter (46) and amplified by a slave amplifier (48) before being compared with a preset threshold level. As with the master unit (30), the threshold detector consists of a rectification stage (50) followed by a comparator (52) that has a circuit (54) to provide a threshold voltage. Alternatively, separate comparators are used for positive and negative signals with the outputs combined to give a single alarm signal instead of a rectifier (50) and a single comparator (52).

The output from the slave comparator (52) is communicated to the master unit (30). A cable connects the output of the slave unit (32) to the input (34) of the master unit (30). The OR gate (36) ensures that the ALARMED state activates when either or both of the master and slave comparators (12, 52) pass to logic level one.

There are several other possible configurations such as locating the two complete electronics channels of FIG. 2 in one single unit with one or both magnetic sensors (4, 44) arranged external to the unit and connected by leads to the unit.

The split of the second sensor channel between the master and slave units (30, 32) can be made at any point e.g. after the filter (46), or the amplifier (48), or the rectifier (50) or after the comparator (52) as illustrated in FIG. 2.

It is, however, beneficial from the point of view of minimising interference pickup that the digital signal is passed as shown in FIG. 2. With any of these embodiments of the present invention the magnetic sensors (4, 44) may be external to the units (30, 32) and connected to them by cables.

Where the analogue signals from the two channels, i.e. before the comparators (12, 52), are together in the master unit, they may be combined in an opposite polarity so that noise that is common to both sensors (4, 44) is cancelled. In this embodiment only one rectifier and comparator are needed.

Whilst effective at detecting ferromagnetic objects, the foregoing embodiments of the present invention may be prone to false alarms. One of the problems with magnetic sensors is that they are omni-directional and they will sense changes in field due to sources outside of the region of interest. Examples may include traffic, filing cabinets being opened, passing trolleys etc. Hospitals have environments where this is particularly frequent and unavoidable so a magnetic sensor would give rise to many false alarms.

Figure 3:
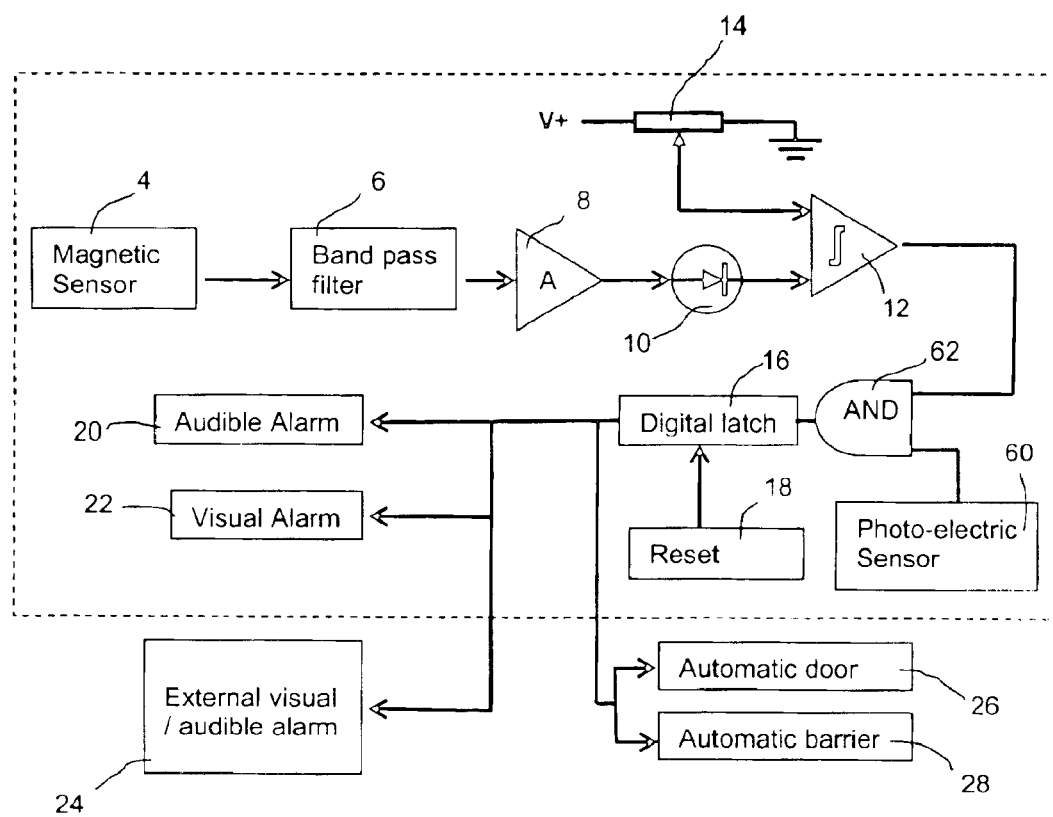
FIG. 3 shows a schematic representation of the ferromagnetic object detector according to the present invention having a complementary, non-magnetic, sensor.

Referring to FIG. 3, to reduce the false alarms, the magnetic sensor (4) is used in conjunction with a complementary, non-magnetic, sensor (60) that senses when a person is passing the magnetic sensor (4). The non-magnetic sensor (60) comprises a photo-electric sensor arranged to detect a person passing through a beam of light. Alternatively, the photo-electric sensor comprises a retro-reflective sensor, a diffuse scan sensor, a fibre-optic sensor or a contrast type optical sensor. The photo-electric sensor is positioned to indicate when a person is actually passing into the room to be protected. The system will only produce an alarm if there is coincidence between the magnetic sensor (4) and the non-magnetic sensor (60), i.e. something is breaking the light beam AND the magnetic signal is above the predetermined threshold level. This is achieved by passing the output from the comparator (12) and the output from the non-magnetic sensor (60) into a logic AND gate (62).

This does leave a false alarm condition when a magnetically clean person is passing into the room simultaneously with an independently caused magnetic signal from elsewhere. However, these occurrences will be rare compared to those if the photo-electric sensor was not used.

In alternative embodiments of the present invention, the non-magnetic sensor (60) comprises any sensor capable of detecting a person moving past the magnetic sensor (4). For example the non-magnetic sensor (60) may comprise a camera, a thermal imager, a passive infrared sensor (PIR), an ultrasonic sensor, a radar sensor (electromagnetic or ultrasonic), an electrostatic sensor, a millimeter wave sensor or a pressure sensitive mat.

As with some of the embodiments of the invention described previously, the magnetic sensor (4) and the non-magnetic sensor (60) may be arranged separately from the main (master) unit but connected to it. In this embodiment of the present invention, the master unit is identical to that shown in FIG. 3, except in that the magnetic sensor (4) and the non-magnetic sensor (60) of FIG. 3 is removed and is mounted separately and connected to the master unit by a cable. Similarly, the non-magnetic sensor (60) is mounted separately from the master unit. This allows the main unit to be located in a convenient place; not necessarily adjacent to the thoroughfare before the room in which the MRI scanner is located.

As discussed previously, for rooms where wide or double doors are used, the sensing range of the embodiment of the present invention shown in FIG. 3 may be insufficient to cover the whole area of the thoroughfare adequately. In this case a second magnetic sensor is required that is placed on the opposite side of the thoroughfare so each sensor needs to only cover half of the width of the thoroughfare.

A similar arrangement to that shown in FIG. 2 and discussed above may be used with the embodiments of the present invention incorporating a complementary non-magnetic sensor (60).

Figure 4:
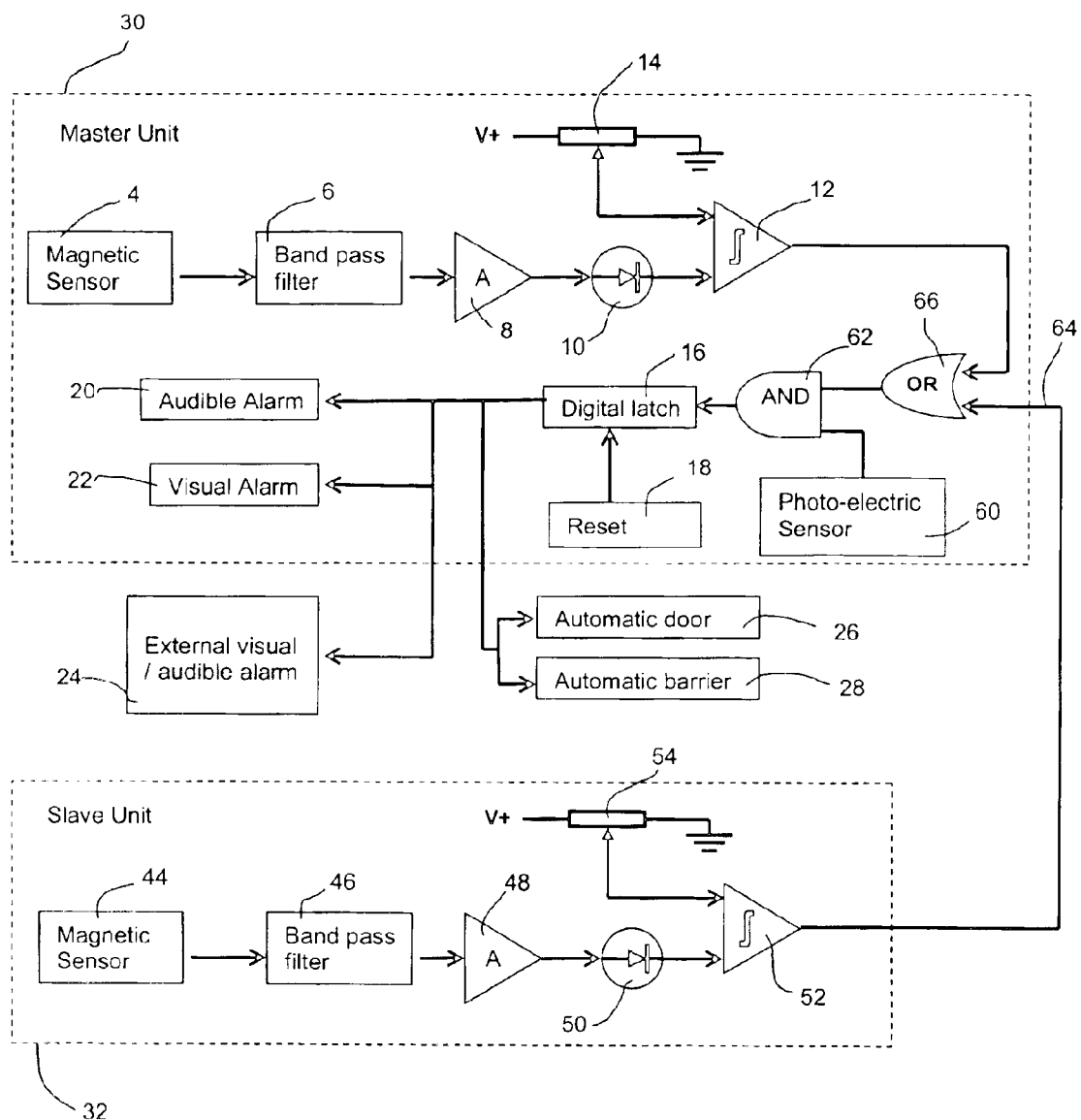
FIG. 4 illustrates an alternative arrangement of the ferromagnetic object detector shown in FIG. 3 incorporating a second magnetic sensor.

Referring to FIG. 4, a master unit (30) and a slave unit (32) are mounted respectively either side of the thoroughfare. The master unit (30) is identical to that of FIG. 3 with the exception of an additional input (64) and a digital OR gate (66). The slave unit (32) comprises a slave magnetic sensor (44) which outputs a signal that is a measurement of the magnetic field incident upon the sensor (44). The output from the slave magnetic sensor (44) is filtered by a band pass filter (46) and amplified by a slave amplifier (48) before being compared with a preset threshold level. As with the master unit (30), the threshold detector consists of a rectification stage (50) followed by a comparator (52) that has a circuit (54) to provide a threshold voltage. Alternatively, separate comparators are used for positive and negative signals with the outputs combined to give a single alarm signal instead of a rectifier (50) and a single comparator (52).

The output from the slave comparator (52) is communicated to the master unit (30). A cable connects the output of the slave unit (32) to the input (64) of the master unit (30). The AND gate (62) operates in conjunction with the OR gate (66) to ensure that the ALARMED state activates when the output from the non-magnetic sensor (60) AND either or both of the master and slave comparators (12, 52) pass to logic level one.

As with the embodiment shown in FIG. 2, there are several other possible configurations such as locating the two complete electronics channels of FIG. 4 in one single unit with one or both magnetic sensors (4, 44) arranged external to the unit and connected by leads to the unit.

The split of the second sensor channel between the master and slave units (30, 32) can be made at any point e.g. before the filter (46), after the filter (46), after the amplifier (48), after the rectifier (50), or after the comparator (52) as illustrated in FIG. 4.

It is, however, beneficial from the point of view of minimising interference pickup that the digital signal is passed as shown in FIG. 4. With any of these embodiments of the present invention the magnetic sensors (4, 44) may be external to the units (30, 32) and connected to them by cables.

Where the analogue signals from the two channels, i.e. before the comparators (12, 52), or before the filters (4, 46), are combined together in the master unit, they may be combined in an opposite polarity so that noise that is common to both sensors (4, 44) is cancelled. In this embodiment only one rectifier and comparator are needed.

Figure 5:
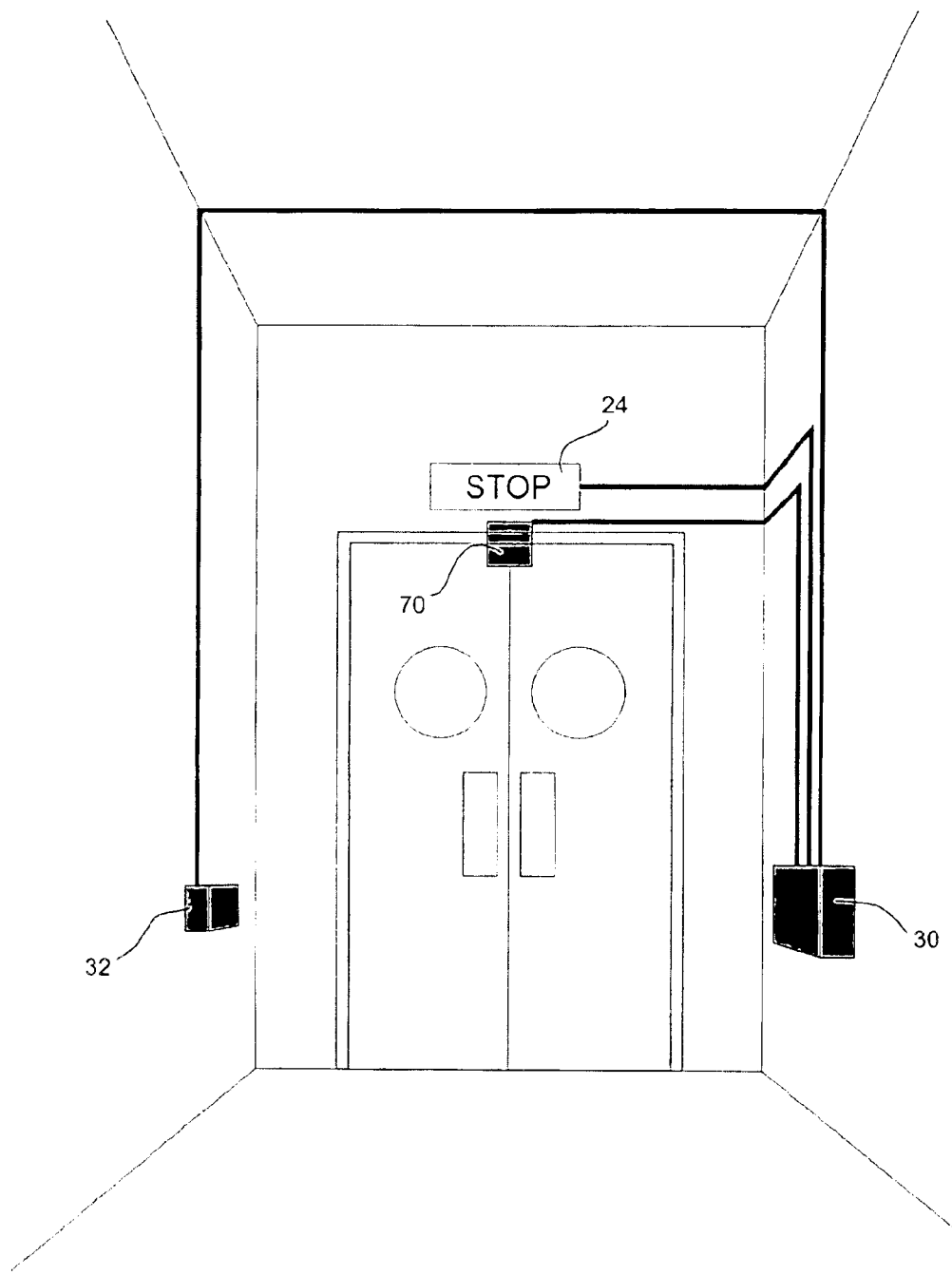
FIG. 5 illustrates a typical installation of a ferromagnetic object detector according to the present invention installed at the entrance to a room in which an MRI scanner is located.

FIG. 5 illustrates how the embodiments of the invention shown in FIGS. 2 and 4 may be installed in a situation where the entrance to an MRI room is at the end of a corridor.

Referring to FIG. 5, the master and slave in units (30, 32) are located either side of the thoroughfare at waist height above the floor because that is the most likely height at which a ferromagnetic material may be inadvertently carried. The master and slave units (30, 32) are also positioned about one meter before the door. An automatic door lock (70) and a visual warning device (24) are also shown in FIG. 5.

Where the MRI room entrance is located in the side of a corridor it is not practical to mount the sensors one meter before the door. In this case the units are mounted on the walls either side of the door. It may not be practical in this case to use an automatic door lock because the door may have been opened before it can be activated. It is important that a clear warning is given in this case.

Where the MRI room entrance is located off a lobby area or a larger room the units could be mounted on stands fixed to the floor a short distance to the door or less preferably on the walls either side as described above.

In some situations it may be deemed that an audible alarm is sufficient and no external warning devices are necessary. One example of this is where the device is not installed on the entrance of a MRI room but at the exit of the preparatory area as a final check after the normal screening procedures.

While there have been shown and described several embodiments of the present invention, it should be understood by those skilled in the art that various changes and modifications may be made therein without departing from the spirit and scope of the invention as claimed.

What is claimed is:

1. An apparatus for detecting a ferromagnetic object comprising
   a passive primary sensor comprising first and second magnetic sensors, the primary sensor adapted to measure an ambient magnetic field within a localized volume of space defined by a zone of sensitivity of the first and second magnetic sensors and to produce a corresponding measurement signal,
   a secondary, non-magnetic, sensor adapted to detect the movement of objects in the vicinity of the primary sensor,
   a signal processor arranged in communication with the primary and secondary sensors, and
   a warning device operable by an output from the signal processor, the warning device adapted to provide within the vicinity of the primary sensor at least one of an audible warning and visible warning, wherein the signal processor is configured to identify temporal variations in the measurement signal due to the movement of a ferromagnetic object within the an ambient magnetic field and to correlate the identified temporal variations in the measurement signal with movement of objects detected by the secondary, non-magnetic sensor, and to provide an output indicative of the presence of a ferromagnetic object in the vicinity of the primary sensor only in the presence of a correlation there-between.

2. An apparatus according to claim 1 wherein the secondary, non-magnetic sensor comprises at least one of a photo-electric sensor, a fibre-optic sensor, a passive infrared sensor, a camera, a thermal imager, an ultrasonic sensor, a radar sensor, an electrostatic sensor, a millimeter wave sensor and a pressure sensitive mat.

3. An apparatus according to claim 1 further comprising an access control device for preventing access to a prohibited area, operable by the output from the signal processor.

4. An apparatus according to claim 3 wherein the access control device comprises at least one of a lock and a barrier.

5. An apparatus according to claim 1 wherein the signal processor comprises a filter arranged to substantially reject spurious variations in the measured magnetic field.

6. An apparatus according to claim 5 wherein the filter comprises a high-pass filter.

7. An apparatus according to claim 6 wherein the high-pass filter is responsive to the measurement signal produced by the primary sensor to attenuate variations therein having a frequency of less than 0.3 Hz.

8. An apparatus according to claim 5 wherein the filter comprises a low-pass filter.

9. An apparatus according to claim 8 wherein the low-pass filter is responsive to the measurement signal produced by the primary sensor to attenuate variations therein having a frequency of greater than 3 Hz.

10. An apparatus according to claim 5 wherein the signal processor comprises a comparator for comparing the amplitude of the output from the filter with an adjustable threshold level so as to indicate temporal variations in the measurement signal due to the movement of a ferromagnetic object within an ambient magnetic field.

11. An apparatus according to claim 1 wherein the first magnetic sensor comprises one of a fluxgate sensor, a magneto-resistive sensor, a magneto-impedance sensor, a hall-effect sensor, and a galvanic coil sensor.

12. An apparatus according to claim 11 wherein the magnetic sensor comprises one of a fluxgate sensor, a magneto-resistive sensor, a magneto-impedance sensor, a hall-effect sensor, and a galvanic coil sensor.

13. An apparatus according to claim 12 wherein, at least one of the first and second magnetic sensors is separable from the signal processor such that, in use, the at least one separable sensor may be disposed remotely to the signal processor.

14. An apparatus according to claim 1 wherein, in use, the primary sensor is arranged to detect ferromagnetic objects in the vicinity of a magnetic resonance imaging scanner.

15. A magnetic resonance imaging scanner comprising an apparatus for detecting ferromagnetic objects according to any one of the preceding claims.

16. A method for detecting a ferromagnetic object comprising the steps of
   (i) measuring an ambient magnetic field using a passive primary sensor comprising first and second magnetic sensors and producing a corresponding measurement signal,
   (ii) detecting the movement of objects in the vicinity of the primary sensor using a secondary, non-magnetic, sensor,
   (iii) identifying temporal variations in the measurement signal produced by the primary sensor due to the movement of a ferromagnetic object within the ambient magnetic field within a localized volume of space defined by a zone of sensitivity of the first and second magnetic sensors,
   (iv) assessing said identified temporal variations in the measurement signal in conjunction with movement of objects detected by the secondary, non-magnetic sensor to determine a correlation there-between, and (v) in the occurrence of a correlation, providing an indication of the presence of a ferromagnetic object wherein the step of providing the indication of the presence of a ferromagnetic object comprises the step of producing within the vicinity of the primary sensor means at least one of an audible and visible warning.

17. A method of preventing the introduction of a ferromagnetic object into the vicinity of a magnetic resonance imaging scanner comprising the steps of (i) providing an apparatus for detecting a ferromagnetic object according to claim 1, (ii) surveying an entrance to a room in which the magnetic resonance imaging scanner is located and identifying at least one preferred mounting position for the apparatus, (iii) installing said apparatus at the at least one preferred mounting position, such that, in use, the apparatus provides a warning upon detection of a ferromagnetic object in the vicinity of the entrance to the room in which the magnetic resonance imaging scanner is located.

18. A method according to claim 17 wherein the at least on preferred mounting position is at the side of the entrance to the room in which the magnetic resonance imaging scanner is located.

19. A method according to claim 17 wherein the at least on preferred mounting position is about 1 metre from the entrance to the room in which the magnetic resonance imaging scanner is located.

20. A method according to claim 17 further comprising the step of (iv) installing an access control device at the entrance to the room in which the magnetic resonance imaging scanner is located such that, in use, the apparatus prohibits entry to the room upon detection of a ferromagnetic object in the vicinity of the entrance.

* * * * *